May 8, 1956 W. SHOCKLEY 2,744,970

SEMICONDUCTOR SIGNAL TRANSLATING DEVICES

Filed Aug. 24, 1951 3 Sheets-Sheet 1

INVENTOR
W. SHOCKLEY
BY
ATTORNEY

INVENTOR
W. SHOCKLEY
BY
ATTORNEY

May 8, 1956 W. SHOCKLEY 2,744,970

SEMICONDUCTOR SIGNAL TRANSLATING DEVICES

Filed Aug. 24, 1951 3 Sheets-Sheet 3

INVENTOR
W. SHOCKLEY
BY
ATTORNEY 2,744,970

SEMICONDUCTOR SIGNAL TRANSLATING DEVICES

William Shockley, Madison, N. J., assignor to Bell Telephone Laboratories, Incorporated, New York, N. Y., a corporation of New York Application August 24, 1951, Serial No. 243,541

8 Claims. (Cl. 179—171)

This invention relates to semiconductor signal translating devices and more particularly to such devices of the class now known as transistors.

Previously known transistors comprise, in general, a body of semiconductive material having three connections thereto, termed the emitter, collector and base. In one manner of operation, signals are impressed between the emitter and base and amplifier replicas thereof obtain in a load circuit connected between the collector and base. The devices may be of any one of several specifically different types. In one, of which the devices disclosed in Patent 2,524,035, granted October 3, 1950 to J. Bardeen and W. H. Brattain are illustrative, the emitter and collector connections are point contacts. In another, of which the devices disclosed in the Bell System Technical Journal, July 1949, pages 435 et seq. and in the application Serial No. 35,423, filed June 26, 1948, now Patent 2,569,347, granted September 25, 1951, of W. Shockley are illustrative, either or both of the emitter and collector include a junction between two zones of opposite conductivity type in the semiconductive body. Such a junction is commonly designated a PN junction and is so referred to herein.

Operation of such transistors entails, in general, injection into the body or into a zone thereof and at the emitter of charge carriers of the sign opposite that of the carriers normally in excess in the body or zone and flow of the carriers to the collector. A limitation in conventional devices of this type results from the relatively long transit times of the injected carriers, whereby the frequency range of operation may be restricted.

One expedient that has been tried to overcome this limitation has been to establish a longitudinal electric field in the body to speed the flow of the injected minority carriers from the emitter to the collector. Devices of this kind are disclosed in United States Patent 2,600,500, which issued to J. R. Haynes et al. June 17, 1952.

One general object of this invention is to improve the performance characteristics of signal translating devices and, more particularly, to extend the frequency range of operation of transistors.

Understanding and appreciation of this invention may be facilitated by a consideration of some salient principles involved in the functioning of semiconductor translating devices. In general, semiconductors, whether elemental, such as germanium or silicon, or compounds, such as copper oxide, may be classified as to conductivity type, that is N or P, N-type material being that which, when associated with a metallic connection, exhibits low impedance to current flow when it is negative relative to the connection and exhibits high impedance when it is positive relative to the connection. P-type material, conversely, exhibits low impedance when it is positive relative to the connection and high impedance when it is negative. When a junction between a connection and a semiconductor or between two semiconductors of opposite conductivity types is polarized in the direction of easy current flow, it is said to be biased in the forward direction. When it is poled to present a high impedance it is said to be biased in the reverse direction.

Conduction in semiconductors of the type usually employed, that is extrinsic semiconductors, occurs by virtue of either electrons or holes, one being normally in excess of the other in the semiconductive material. Specifically, in N-type semiconductors the carriers normally in excess are electrons and conduction is by the electron process; in P-type material, holes normally are in excess and conduction is by the hole process. The carrier normal excess is associated with the class of significant impurities in excess in the semiconductive material. Specifically, donor impurities contribute excess electrons whereas acceptor impurities produce excess holes. As is known, the number of excess impurity centers determine the conductivity of the material, the conductivity increasing as the impurity content increases.

It has been found that in semiconductors, by establishment of appropriate fields therein, regions can be established in which the concentrations of holes and electrons are extremely small, so small as to be negligible in comparison to the values in materials of conductivities of the order, say 0.2 $ohm^{-1}$ $cm^{-1}$ for germanium, usually employed. Such regions are termed herein space charge regions. In such, the fields are very high even for small biases. Hence, any carriers injected into a space charge region will traverse it quickly, i. e. the transit times therefore will be very small.

Space charge regions can be established in semiconductors in several ways. For example, such a region of prescribed thickness can be produced adjacent a PN junction by applying a reverse bias across the junction. Under this condition of bias, there obtains a space charge region at and extending to both sides of the junction, of thickness which is dependent upon the potential across the junction and the impurity concentration gradient adjacent the junction. The capacitance across the junction, which is a measurable quantity, is a measure of the thickness of the space charge region as will be pointed out hereinafter.

The basic process in the operation of such previously known transistors is the injection of minority carriers from the emitter into a base region having a relatively high concentration of majority carriers. In this base region of injection, space charge neutrality is maintained by the flow therein of majority carriers which neutralize the space charge of the minority carriers. There consequently results an increase in the total number of carriers in the injection region and a consequent increase in the conductance of this region. This change in conductance is made to produce changes in the current flow in the collector circuit. Since carriers of both kinds are necessarily involved in the basic processes of operation in such transistors, such operation may be characterized as bipolar.

It is characteristic of bipolar operation that the transit time of minority carriers in the region of injection provides a limitation to the upper frequency limit of operation.

An object of this present invention is to minimize the role of minority carriers and thereby increase the frequency limit at which transistors operate effectively.

To this end, the present invention provides a novel form of transistor which is especially well adapted for high frequency operation. In particular, this novel form of transistor is characterized by unipolar operation, and an absence of any significant role for minority carriers in the basic processes of operation.

In an illustrative embodiment of the invention, a semiconductive body comprises a main zone of one conductivity type which serves as a channel for the flow of majority carriers. A pair of members which shall be termed the source and drain make low resistance connections to separated regions of this zone. Between the source and the drain connections, the body further includes a control zone of the opposite conductivity type contiguous with the main zone and forming an extended *p—n* junction therewith along a region intermediate between the source and the drain connections. A connection which shall be termed the "gate" is made to this control zone. In operation the *p—n* junction is biased in the reverse direction by the application of suitable potentials to the connections to the body and, as a consequence, there is formed at the *p—n* junction a space charge region which extends into the main zone of the body an amount which is determined by the extent of the reverse bias across the *p—n* junction. Such bias also tends to discourage the flow of minority carriers from the control zone into the main zone. In this respect, the operation is unipolar since only majority carriers are now significant in determining the conductance of the main zone. When modulating signals are impressed on the reverse bias on the rectifying junction there is varied correspondingly the extent of penetration of the space charge region into the main zone of the body. Since a space charge region acts as a high resistance region, variation in the extent of penetration of the space charge region into the main zone varies correspondingly the effective conductance of this zone. In effect, the electric field set up by the voltage applied across the *p—n* junction controls the conductance of the channel which serves as the path of majority carrier flow between the source and the drain connections. For these reasons, it is believed appropriate to characterize the novel transistor of the present invention as a "field effect" transistor.

Semiconductor bodies including PN junctions and suitable for use in the practice of this invention may be produced in several ways, one particularly advantageous method being disclosed in the application Serial No. 168,184 filed June 15, 1950 of G. K. Teal. In brief, in the method disclosed in that application, a seed of germanium is dipped into and then withdrawn from a germanium melt at a rate to withdraw some of the molten material. During the withdrawal, the conductivity type of the melt is altered once or several times by the addition of appropriate impurities to the melt, each such alteration resulting in an inversion in the conductivity type in a zone of the drawn body. For example, if the melt initially is of N conductivity type it can be converted to P-type by addition of an acceptor impurity, for example gallium, thereto and subsequently made N-type by addition of a donor impurity, for example antimony, thereto, whereby the drawn body is of NPN construction. The drawn body is of homogeneous single crystal form. By correlation of the quantities of the added impurities and the withdrawal rate, the concentration gradients in the several zones may be controlled. As disclosed in the application Serial No. 211,212, filed February 16, 1951 of W. Shockley, improved uniformity in the concentration gradient adjacent a PN junction may be effected by heating the body at about 900° C. for an extended period, say twenty-four hours, to cause diffusion of the impurities.

The invention and the several features thereof will be understood more clearly and fully from the following detailed description with reference to the accompanying drawing in which.

Figure 1:
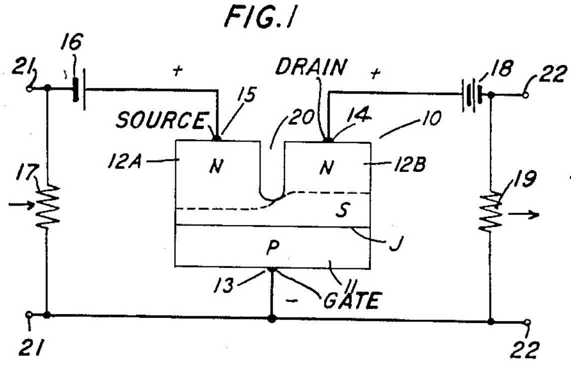
Figs. 1 through 4 show various alternative amplifier embodiments of the invention in each of which the extent of penetration of a space charge region into a channel in a semiconductive body is made to vary the conductance of the channel.

In the embodiment of this invention illustrated in Fig. 1, the semiconductive, e. g. germanium, body 10 comprises two N-type zones 12A and 12B contiguous with the P zone 11. Such body may be fabricated for example by milling a thin slot 20, say $1\times10^{-3}$ inches wide, in the N zone of a body containing an NP junction. The slot may be substantially rectangular as illustrated or of other form for example V-shaped. As shown in Fig. 1, the base of the slot 20 is in immediate proximity to the junction J, an illustrative spacing of the two being $1\times10^{-3}$ inches. Ohmic connections 15, 14 and 13 are made to the zones 12A, 12B and 11 and function as the source, drain and gate respectively. Both the source 15 and drain 14 are biased positive relative to the base 13, as by voltage supplies such as 16 and 18, whereby the junction J is biased in the reverse direction. The source bias is made much smaller than that upon the drain and both biases are such that a space charge region S which intersects the base of the slot 20 obtains. In a typical device wherein the junction to slot spacing was as noted above and the conductivity of the N zones of the germanium body 10 was about 0.2 $ohm^{-1}$ $cm.^{-1}$, a source bias of 90 volts and a drain bias of 130 volts have been found satisfactory.

Because of the relative biases upon the source and drain, the former is negative with respect to the latter. Accordingly, the source will introduce electrons into the space charge region S for flow towards the drain. These electrons are subjected to an intense electric field, particularly at the narrow portion of the space charge region between the zones 12A and 12B, and are abstracted by the drain 14.

Variations in the potential difference between the source and gate, resulting from a signal impressed between the input terminals 21, produce corresponding variations in the space charge region S in the vicinity of the base of the slot 20 and also corresponding variations, representing a power gain, across a load 19 connected between the output terminals 22. The drift velocity of the electrons is high so that the transit times from source to drain are short. Hence, high frequency operation is realizable.

Figure 2:
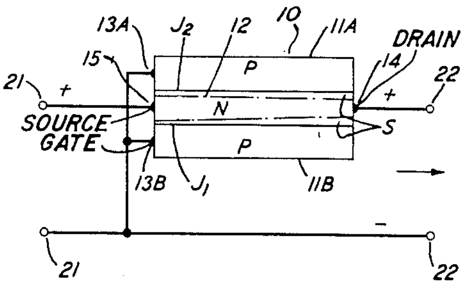

In the embodiment of the invention illustrated in Fig. 2, the semiconductive body 10 comprises an N-type zone 12 between two P-type zones 11A and 11B, ohmic source and drain connections 15 and 14 to opposite ends of the N zone, and ohmic gate connections 13A and 13B to the P zones. Both the source and drain connections are biased positive with respect to the gate connections 13, the potential applied to the drain being much greater than that upon the source, as in the embodiment illustrated in Fig. 1. Thus, the junctions $J_1$ and $J_2$ are biased in the reverse direction and, because of the high bias in the vicinity of the drain 14 a space charge region S is established in the N-type zone between the source and drain. Modulating signals impressed between input terminals 21 modulate correspondingly the extent of the penetration into the N-type zone of the space charge region and, accordingly, modulate correspondingly the conductance of the path between the source and drain connections and the voltage developed across the output terminal 22.

Figure 3:
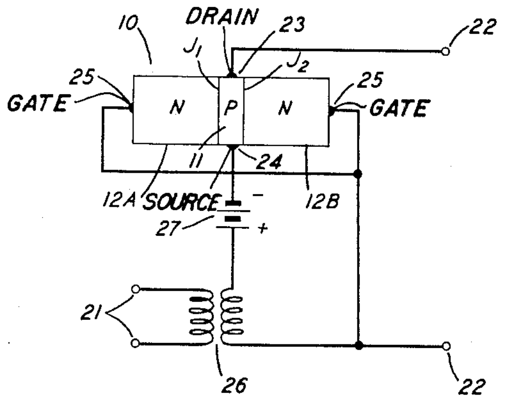

In the arrangement illustrated in Fig. 3, the semiconductive body 10, for example of germanium, includes outer N-type zones 12A and 12B having ohmic connections 25 thereto, and a thin intermediate P zone 11 having a pair of ohmic connections 23 and 24 thereto. The latter connections may be fabricated, for example in the manner disclosed in the application Serial No. 228,483, filed May 26, 1951 of W. Shockley, now Patent 2,654,059 granted May 26, 1951. The junctions $J_1$ and $J_2$ between the P and the N zones are biased strongly in the reverse direction by a voltage supply 27, whereby space charge regions are established at these junctions. The potential across these junctions is varied in accordance with signals as by way of an input transformer 26.

Figure 4:
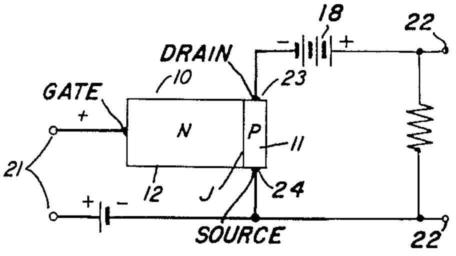

As has been pointed out hereinabove, the width of a space charge region at a PN junction is dependent upon the voltage across the junction. Thus, as the voltages across the junctions $J_1$ and $J_2$ in Fig. 4 are varied in response to input signals applied by way of the transformer 26, the width of the space charge regions at these junctions likewise varies. Consequently, the impedance between the drain and source connections 23 and 24 varies accordingly with corresponding changes in the current to a load connected between the output terminals 22.

The embodiment of the invention illustrated in Fig. 4 is generally similar to that shown in Fig. 3 differing therefrom in that the semiconductive body 10 has therein a single PN junction J which is biased in the reverse direction by the voltage supply 27 to produce a space charge region at the junction. The voltage supply 18 is connected between the source and drain connections so that the source connection will introduce majority carriers and the drain connection collect them. Signals applied between the input terminals 21 vary the voltage across the junction with consequent changes in the width of the space charge region and the impedance between the drain and source connections 23 and 24 to the P zone 11. There is modified correspondingly the voltage across the load 19 connected across output terminals 22.

It will be understood, of course, that the invention is of general application, that is to devices involving conduction by either the electron or hole process. Thus, for example, whereas in the embodiment illustrated in Fig. 1 the carriers are electrons, the invention may be embodied in a like device with the polarities and conductivities reversed. Specifically, in a device of the configuration of Fig. 1, the zones 12A and 12B may be of P-type, the zone 11 of N-type and the first two biased negative relative to the third, whereby holes injected into the space charge region would flow to the drain.

Figure 5:
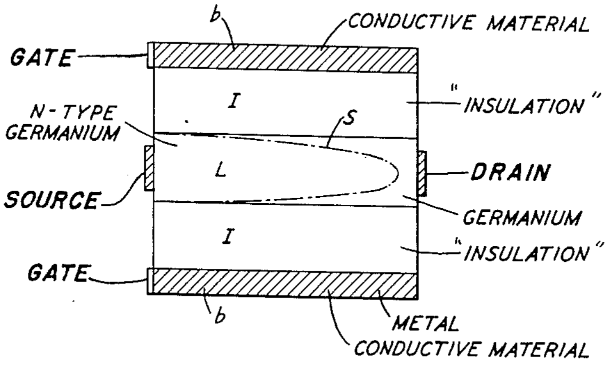
Fig. 5 is a functional diagram which will be referred to hereinafter in a detailed explanation of the principles of operation of devices in accordance with the invention.
Figure 7:
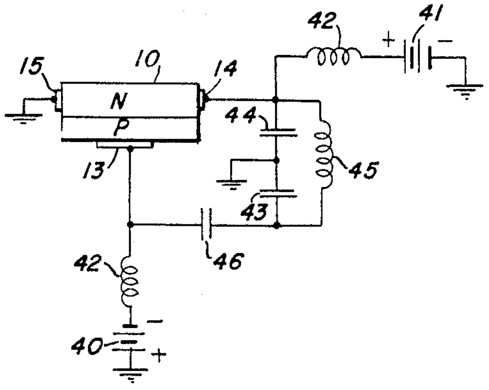
Fig. 7 is a circuit schematic of an oscillator including a transistor in accordance with the invention.

The correlation of parameters to be utilized in the construction and operation of any particular device will be understood from the following considerations with reference to Fig. 5.

This figure shows a structure consisting of a layer L of N-type semiconductor which extends from the source connection to the drain connection. These electrodes are supposed to carry current to L by the electron process predominantly so that the currents carried by holes are negligible. Outside of the layer L there are "insulating regions." Currents through these regions are also supposed to be negligible. Each of these regions may consist of the space charge region adjacent a PN junction biased in the reverse direction as discussed in connection with Figs. 1 to 4, inclusive. The example of Fig. 5 has been drawn as symmetrical between top and bottom to facilitate exposition.

If source and drain are connected to ground and a negative bias is applied to the *b*-regions, then the condenser between the *b*-regions and L will become charged. Its charge will increase with increasing negative charge on layer L. Favorable conditions of performance arise when the applied voltage is sufficient to drive conduction electrons substantially completely out of a portion of layer L so as to leave it in a space charge condition.

The dashed lines in Fig. 5 represent schematically the way in which the space charge region will extend into L when the drain is biased sufficiently positive. Since the source is not biased so far positive, the space charge layer extends a smaller distance into L near it. When the space charge situation as shown in Fig. 5 obtains, voltage and power gain may be obtained by operating with grounded source and input applied to the gate. The voltage gain is a consequence of the high drain impedance that results from the space charge region near the drain. The reason is that once the space charge layer is formed in front of the drain, additional positive drain bias does not drive it much farther away. As a result, the distribution of conductivity in the L layer is only slightly affected and the current of electrons only slightly reduced.

Under these conditions of operation, the voltage drop along the conducting portion of the L layer may be a considerable fraction of the voltage required to bias the layer to space charge. A typical value for this "pinch-off" voltage is 100 volts. The transit time of electrons down the layer may be estimated from the formula $$t=(\text{length})^2/\mu V$$

where $t$=transit time, $\mu$=carrier mobility and $V$=voltage. The length of the layer may be $5\times10^{-3}$ centimeters for example. For this value, the transit time for electrons in germanium will thus be $$t=25\times10^{-6}/2{,}600\times100=7\times10^{-11}\text{ sec.}$$

Actually the transit time will be somewhat longer because for such high fields, the mobility of electrons is reduced. At a field of $10^4$ volts per centimeter, the velocity of electrons in N-type germanium is about $8\times10^6$ centimeters per second and increases to about $10^7$ centimeters per second at $4\times10^4$ volts per centimeter. These velocities will lead to transit times of about $$t=5\times10^{-3}/10^7=5\times10^{-10}\text{ sec.}$$

in the example.

It is thus evident that even if the decrease in mobility in high electric fields is allowed for, very short transit times will occur permitting operation at frequencies not accessible to previously known transistor structures of comparable size. It may also be remarked that the dependence of mobility upon electric field tends to produce currents independent of voltage, at least in the ranges of high electric fields, and this may contribute to the high impedance of the collector.

Some generalities regarding the "pinch-off" condition can be made which will apply to a variety of structures. Thus if the carriers in the layer have a charge density of 2 Q per unit area, or Q in each half of L, then the dielectric displacement D required to "pinch-off" the layer must be $$D=Q$$

in MKS units. This displacement produces a field E in the insulating region of $$E=D/K\epsilon_0$$

where K is the dielectric constant and $\epsilon_0$ is permittivity of free space. If the field in the insulating region is limited to some maximum value, E′, such as the Zener field in a PN junction or the breakdown field in an insulator, then the maximum charge density that can be pinched off is $$2Q=2K\epsilon_0E'$$

If the mobility of the carriers is $\mu$, then the maximum conductivity of a unit square that can be pinched off is $$G=2\mu Q=2K\epsilon_0E'\mu$$

For N-type germanium with $E'=10^5$ volts/cm.$=10^7$ volts/meter as discussed above, and $\mu$=0.36 meter 2/volt sec.

$$G=2\times16\times8.85\times10^{-12}\times0.36\times10^7=1.0\times10^{-3}\text{ mho}$$

A knowledge of this factor is of value in designing a unit or in controlling it in fabrication. Evidently an advantageously designed unit will have a conductivity per unit area no larger than this value.

If a limiting drift velocity $v'$ occurs at high fields, then the above considerations lead to a determination of the maximum current per unit length that may flow in the unit. This current will be $$I=v'2Q=2v'K\epsilon_0E'$$

For $v'=10^7$ cm./sec. $=10^5$ meters/sec., $K=16$ and $E'=10^7$ volts/meter, this gives about 300 amperes/meter. In a one-sided unit 0.5 millimeter long this value would be reduced to 75 milliamperes. Furthermore, if the layer is substantially thinned down by space charge, the current will be even less.

From these considerations it is evident that the limiting currents in the devices may be undesirably small unless the maximum permissible values of G and Q are approached closely.

Another mechanism that may reduce the effectiveness of the modulation is that of charge trapping in surface states. Surface states may occur on the interface between the L layer and the insulating regions. These surface states may acquire some of the charge produced by the dielectric displacement. One of the advantages of operating through a PN junction as in the arrangements shown in Figs. 1 through 4 rather than through an insulating layer is that there is no discontinuity in structure leading to surface states.

The formulae relating concentration gradient, denoted by $a$, dielectric constant K, voltage V, and width W for the junction are discussed in the Bell System Technical Journal, volume 28, page 435, "The Theory of $p$—$n$ Junctions in Semiconductors and $p$—$n$ Junction Transistors" by W. Shockley. In brief, in the space charge layer $$d^2V/dx^2=-\rho/K\epsilon_0$$

where the charge density $\rho$ is $$\rho=qa_mx$$

where $x$ is the distance from the junction (i. e. the plane at which donor and acceptor densities cancel), $\epsilon_0=8.854\times10^{-12}$ farads/meter is the permittivity of vacuum in MKS units in which the equation is expressed, $q$ is the electronic charge, and $K=16$ for germanium. The integration of this equation yields $$V=(qa_m/6K\epsilon_0)(3(W_m/2)^2x-x^3)$$

for the solution which satisfies the boundary condition of zero field at $x=\pm W_m/2$. The potential difference across the junction when its width is $W_m$ meters is thus $$V=qa_mW_m^3/12K\epsilon_0 \text{ (volts)}=9.4\times10^{-11}a_mW_m^3$$

and the capacity per unit area is $$C_m=K\epsilon_0/W_m=1.42\times10^{-10}/W_m \text{ (farads/meter}^2)$$

For values of $a$ in cm.$^{-4}$, W in cm. and C in micromicrofarads/cm.$^2$, these equations become $$V=9.4\times10^{-9}aW^3$$

$$C=1.42/W$$

The electric field is not uniform in the space charge region and has a peak value of $$(dV/dx)_{max}=1.5 \text{ v./}W$$

Figure 6:
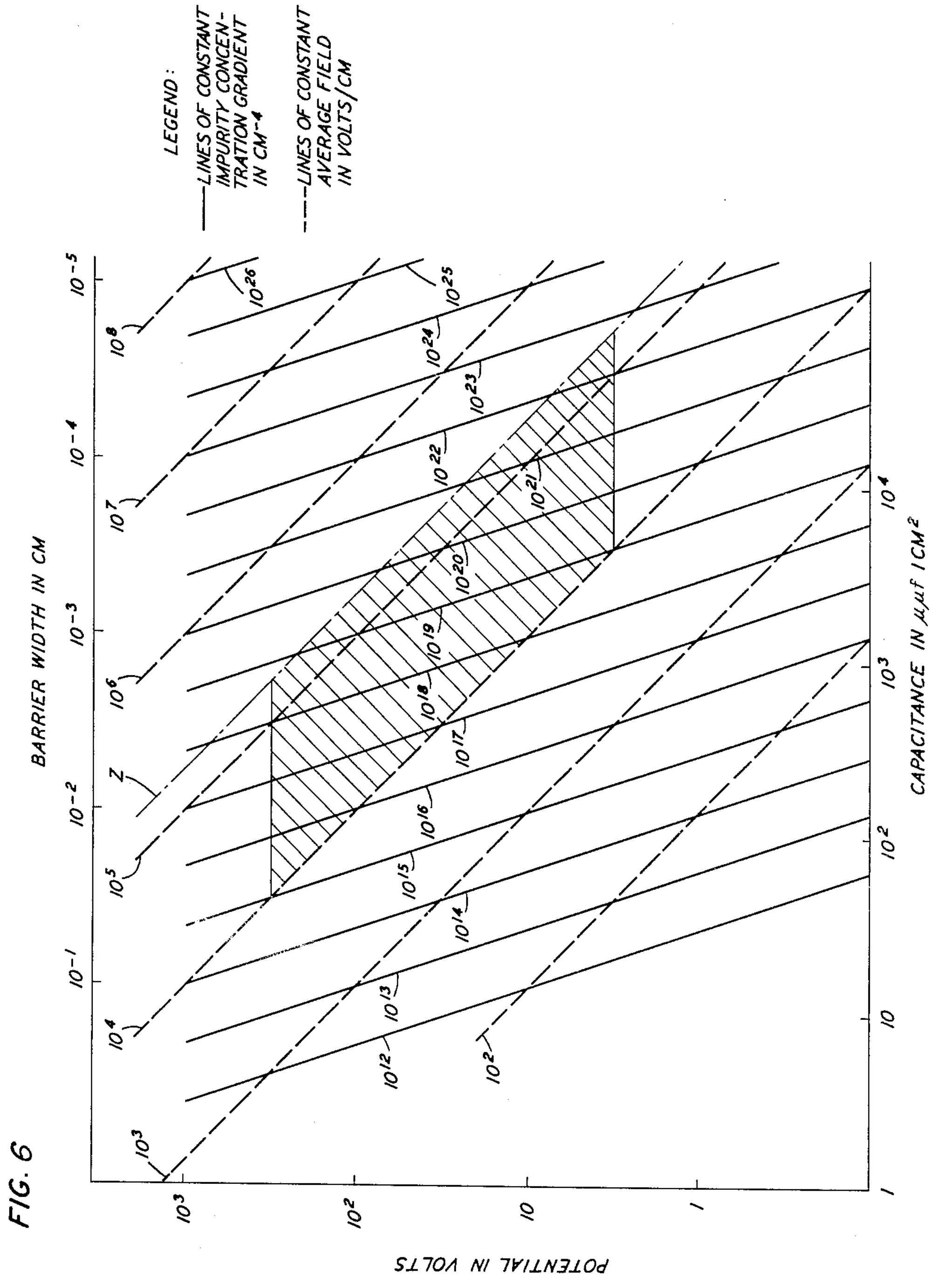
Fig. 6 is a graph showing the relationship of several parameters of interest in the performance of devices in accordance with the invention.

Fig. 6 shows values of $V/W$, the average value of the field. As mentioned above, good design calls for values of $V/W$ less than $10^5$ volts/cm.

Fig. 6 presents graphs for germanium (of which the dielectric constant is considered to be 16) having a PN junction therein. In this figure, the ordinates are reverse bias in volts across the junction and the abscissae are junction capacitance per unit area (square centimeter) or width of the barrier or space charge region, width being measured normal to the junction. The solid lines are those of constant concentration gradient in units /cm.$^3$/cm. or cm.$^{-4}$ and the dotted lines are those of constant average field in volts/cm. The line Z represents the lower limit of the range requisite for the so-called Zener current operation which is disclosed in detail in the application Serial No. 211,212 referred to hereinabove. In brief, in this mode of operation over an extended range of reverse currents, the voltage across the junction remains substantially constant, or viewed in another way when a critical voltage is applied in the reverse direction, the junction in effect breaks down.

In the operation of devices in accordance with this invention, the voltage applied across the junction should be below that corresponding to the onset of the Zener current range. For example, for a device wherein the concentration gradient is $10^{18}$/cm.$^{-4}$, a reverse bias across the junction of about one hundred volts or less may be employed. For these values, it will be noted from Fig. 6 that the width of the barrier or space charge region is somewhat greater than $10^{-3}$ cm. and the average field is somewhat less than $10^5$ volts per cm.

As a practical consideration, it is desirable to operate amplifying and oscillating devices with voltages no more than a few hundred volts. Furthermore, in order to have effective modulation of relatively large currents, operation should be near the maximum allowed value of average field. This leads to selecting the cross-hatched area in Fig. 6 as one especially advantageous for operation.

Calculations of a similar nature can be carried out for cases in which the concentration gradient is not uniform. An example of such a case is furnished by a thin layer of one conductivity type produced on the surface of a body of the opposite type by the diffusion of donors or acceptors inwards from the surface.

Although the invention has been described thus far with particular reference to amplifiers, it is of course, applicable to devices for performing other functions. For example, the invention may be embodied in oscillators, an illustrative configuration of which including a device of the type shown in Fig. 1 and described hereinbefore is represented in the Colpitts-type oscillator shown in Fig. 10. As there shown, the gate 13 is biased in the reverse direction by the voltage supply 40 and the drain 14 is maintained positive with respect to the source 15 by the voltage supply 41. Blocking inductances 42 are positioned in series with the voltage supplies to provide a high impedance to the oscillating signals. The oscillating circuit includes the capacitances 43 and 44 and the inductance 45. A blocking capacitance 46 is included to serve as an impedance to direct current flow between the drain and the gate.

Further, although several specific embodiments of the invention have been shown and described, it will be understood that they are but illustrative and that various modifications may be made therein without departing from the scope and spirit of this invention.

What is claimed is:

1. In combination, a semiconductive body including a first zone of one conductivity type and a second zone of opposite conductivity type contiguous with said first zone and forming a rectifying junction therebetween, source and drain connections to said first zone spaced apart therealong near opposite ends of said rectifying junction, and a gate connection to said second zone; an input circuit connected between the source and gate connections including an input signal source and means for biasing said junction in reverse to a high impedance condition and to discourage minority carrier injection into the first zone from said second zone; and an output circuit connected between the source and drain connections including a load and means for biasing the drain connection relative to the source connection so as to supply majority carriers to the first zone from said source connection and to collect majority carriers from said first zone to said drain connection.

2. The combination of claim 1, in which said second zone extends contiguous to the first zone so as to form a rectifying junction which extends substantially the entire distance between said source and drain connections to the body.

3. In combination, a semiconductive body including a first zone of one conductivity type and a pair of zones of the opposite conductivity type on opposite sides of said first zone and forming therewith a pair of opposed rectifying junctions, source and drain connections to the first zone which are spaced apart therealong at opposite ends of said pair of opposed rectifying junctions, and a gate connection to said pair of zones; an input circuit connected between the source and gate connections including an input signal source and means for biasing said pair of opposed rectifying junctions in reverse to a high impedance condition and to discourage minority carrier injection into the first zone from said pair of zones; and an output circuit connected between the source and drain connections including a load and means for biasing the drain connection relative to the source connection so as to supply majority carriers to the first zone from said source connection and to collect majority carriers from said first zone at said drain connection.

4. The combination of claim 3 in which said pair of zones extend contiguous with said first zone so as to form rectifying junctions which extend substantially along the entire distance between said source and drain connections to the body.

5. In combination, a semiconductive body comprising a first zone of one conductivity type, means for introducing majority carriers into said zone and means for abstracting majority carriers from said zone connected to spaced regions of said first zone, means including a second zone of the body of the opposite conductivity type forming a rectifying junction with said first zone therealong intermediate between the introducing and abstracting means for controlling the conductance of the path in said first zone between said introducing and abstracting means; an input circuit connected between said introducing means and said second zone including means for biasing said rectifying junction in the reverse direction to discourage the flow of minority carriers from the second zone to the first zone and to form a space charge region penetrating into the first zone and means for varying in accordance with signal information the penetration of said space charge region into the first zone for varying correspodingly the conductance of the path between said introducing means and abstracting means; and an output circuit forming a current path between said introducing and abstracting means including a load and means for biasing the abstracting means relative to the introducing means and to the body so as to supply majority carriers to the first zone from said introducing means and to collect majority carriers from said first zone at said abstracting means.

6. In combination, a semiconductive body comprising a first zone of one conductivity type, means for introducing majority carriers into said zone and means for abstracting majority carriers from said zone connected to spaced regions of said zone, means including second and third zones of the opposite conductivity type on opposite sides of the first zone, each forming a separate rectifying junction with the first zone which extends along the body intermediate between the introducing and abstracting means; an input circuit connected between said introducing means and said second and third zones including means for biasing said rectifying junctions in the reverse direction to discourage the flow of minority carriers from the second and third zones to the first zone and to form a space charge region which penetrates into the first zone, and signal means for varying the penetration of said space charge region into the first zone for varying correspondingly the conductance of the path between said introducing means and abstracting means; and an output circuit forming a current path between said introducing means and abstracting means including a load and means for biasing the abstracting means relative to the introducing means and the body so as to supply majority carriers to the first zone from said introducing means and to collect majority carriers from said first zone at said abstracting means.

7. In combination, a semiconductive body comprising a first zone of one conductivity type and a second zone of opposite conductivity type contiguous therewith and forming a rectifying junction therebetween, first and second electrodes connected to regions of said first zone near opposite ends of said rectifying junction, a third electrode connected to said second zone, means connected between said third electrode and the first electrode including means for biasing the rectifying junction in the body so as to discourage the flow of minority carriers of the type predominant in the second zone from the second zone to the first zone and means for varying the potential of the second zone relative to the first zone in accordance with signal information, means connected between the first and second electrodes for applying a bias such that the first electrode acts to supply majority carriers to the first zone and the second electrode acts to collect majority carriers from the first zone, and means connected to the second electrode for deriving output replicas of the signal potential variations set up between said first and second zones.

8. In combination, a semiconductive body comprising a first zone of one conductivity type intermediate between a pair of zones of the opposite conductivity type for forming a pair of opposed rectifying junctions in the body, first and second electrodes connected to regions of said first zone spaced therealong at opposite ends of said pair of rectifying junctions, third and fourth electrodes connected to respective ones of said pair of zones in the body, means connected between the first electrode and the third and fourth electrodes including means for biasing the pair of rectifying junctions in the body so as to avoid the flow of carriers of the type predominant in said pair of zones from said pair of zones into the first zone and means for varying the potential across the pair of rectifying junctions in accordance with signal information, means connected between the first and second electrodes for applying a bias such that the first electrode acts to supply majority carriers to the first zone and the second electrode acts to collect majority carriers from the first zone, and means connected to said second electrode for deriving replicas of the signal potential variations set up across the pair of rectifying junctions.

References Cited in the file of this patent

UNITED STATES PATENTS

| | | |
|---|---|---|
| 2,502,488 | Shockley | Apr. 4, 1950 |
| 2,517,960 | Barney | Aug. 8, 1950 |
| 2,524,035 | Bardeen et al. | Oct. 3, 1950 |
| 2,553,490 | Wallace | May 15, 1951 |
| 2,570,978 | Pfann | Oct. 9, 1951 |
| 2,600,500 | Haynes et al. | June 17, 1952 |

OTHER REFERENCES

Electronics, September 1948, pp. 68–71.

Audio Engineering, October 1948, pp. 32, 33, 51, 52.